United States Patent [19]

Bauman

[11] 4,338,479
[45] Jul. 6, 1982

[54] SURFACE THERMOCOUPLE ASSEMBLY AND METHOD OF MAKING SAME

[75] Inventor: Ralph H. Bauman, Genoa City, Wis.

[73] Assignee: Pneumo Corporation, Boston, Mass.

[21] Appl. No.: 147,834

[22] Filed: May 8, 1980

[51] Int. Cl.³ .............................................. H01F 35/02
[52] U.S. Cl. ..................................... 136/229; 29/573; 136/232; 136/233; 136/242
[58] Field of Search ...................... 73/359 R; 29/573; 136/220, 221, 229, 230, 232, 233, 242

[56] References Cited

U.S. PATENT DOCUMENTS

| | | | |
|---|---|---|---|
| 2,048,681 | 7/1936 | Davidson et al. | 136/232 |
| 3,016,412 | 1/1962 | Ross | 136/233 X |
| 3,143,439 | 8/1964 | Hansen | 73/359 R X |
| 3,533,288 | 10/1970 | Franck | 136/230 X |
| 3,907,606 | 9/1975 | Chang | 136/233 |
| 4,043,200 | 8/1977 | Finney | 136/230 X |
| 4,114,444 | 9/1978 | Schwenninger | 136/233 X |
| 4,164,433 | 8/1979 | Granahan et al. | 136/229 |

Primary Examiner—Leland A. Sebastian

Attorney, Agent, or Firm—Maky, Renner, Otto & Boisselle

[57] ABSTRACT

A surface thermocouple assembly and method of making same, characterized by a sheathed thermocouple cable having a sensing end including a preformed segment of solid metal welded to the end face of the sheath. The preformed metal segment has a contact face extending the full length thereof substantially parallel to the adjacent axial portion of the cable and adapted for contiguous intimate contact with the skin or external surface of the member whose temperature is to be monitored. Axially inwardly spaced a short distance from the end face of the sheath is a measuring junction which is formed by welding the ends of the thermocouple wires to the inside diameter of the sheath. Insulation material completely surrounds the measuring junction, and the end face of the sheath is closed by an end closure of weld metal which is ground flat to provide a uniformly flat attachment surface for attachment of the preformed segment thereto as by butt welding around the entire periphery of such surface.

17 Claims, 5 Drawing Figures

U.S. Patent
Jul. 6, 1982
4,338,479
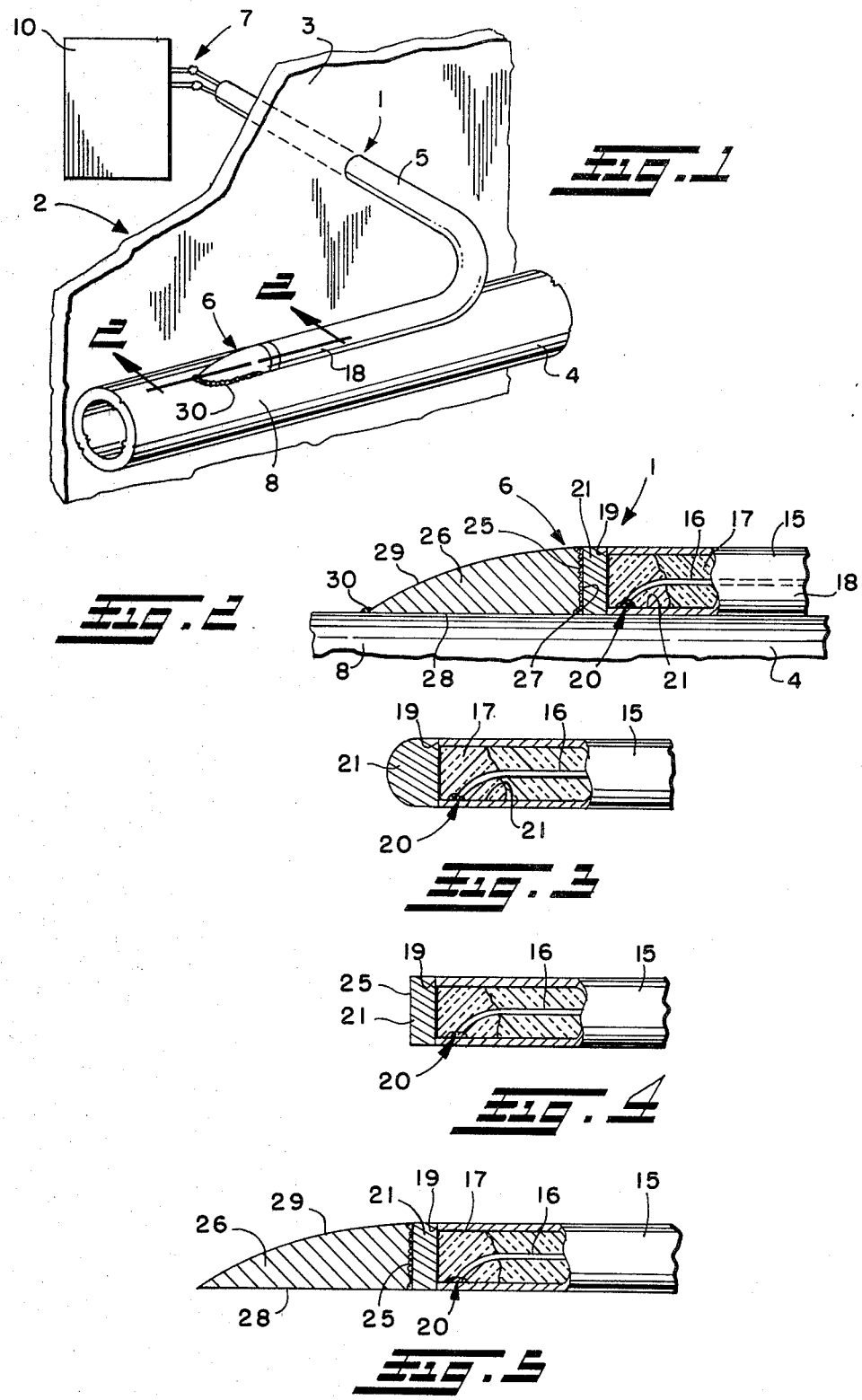

SURFACE THERMOCOUPLE ASSEMBLY AND METHOD OF MAKING SAME

BACKGROUND

This invention relates generally, as indicated, to a surface thermocouple assembly and method of making same, and more particularly, to certain improvements in thermocouple assemblies especially of the type disclosed in U.S. Pat. No. 4,164,433 and their method of fabrication.

The thermocouple assembly of such patent generally consists of a sheathed thermocouple cable having an angularly disposed sensing end, with the sheath terminating at such sensing end in an open end face substantially parallel to the axis of the adjacent axial portion of the sheath. At the sensing end is an end cavity substantially free of insulating material, with a thermojunction of the thermocouple conductors formed in the cavity and an end closure of weld metal substantially filling the cavity embedding the thermojunction therein. The end closure has an exposed face substantially parallel to the axis of the sheath to provide a contact face adapted for contiguous intimate contact with the work surface whose temperature is to be monitored, and such end closure also provides a short direct heat path between the thermojunction and such work surface.

One drawback to such a thermocouple assembly is that some difficulty may be encountered in filling the end cavity of the sheath with filler metal, making such end closures somewhat costly to fabricate. Moreover, the desired weld integrity of such end closures may be hard to maintain, and the shape of the weld metal end closure could be difficult to control. End closures of the best possible integrity with a more consistent shape make them better suited for weld attachment by the customer to the heated surfaces which are to have their temperatures monitored.

SUMMARY OF THE INVENTION

With the foregoing in mind, it is the principal object of this invention to provide a surface thermocouple assembly of the type indicated with an end closure which has a more consistent shape and the integrity of which is assured.

Another object is to provide such a thermocouple assembly in which the measuring junction of the thermocouple is positively positioned to the side of the thermocouple which will ultimately be in contact with the surface to be sensed.

These and other objects of the present invention may be achieved by providing a thermocouple assembly in which the measuring junction is formed by welding the ends of the thermocouple wires to the inside diameter of the sheath a short distance inwardly of the axial outer end thereof. The open space at the end of the sheath surrounding the measuring junction is packed with insulation, and the axial outer end of the sheath is closed by welding. Such end closure of weld metal is ground flat perpendicular to the longitudinal axis of the cable, and a preformed segment of solid metal is welded to the end closure to provide an end configuration of a more consistent shape having the desired integrity to facilitate direct welding of the sensing end of the thermocouple to a tube or other heated surface whose temperature is to be monitored.

To the accomplishment of the foregoing and related ends, the invention, then, comprises the features hereinafter fully described and particularly pointed out in the claims, the following description and the annexed drawings setting forth in detail a preferred embodiment of the invention, this being indicative, however, of but one of the various ways in which the principles of the invention may be employed.

BRIEF DESCRIPTION OF THE DRAWINGS

In the annexed drawings:

FIG. 1 is a fragmented perspective view of a furnace or the like illustrating the installation of a preferred form of thermocouple assembly according to the present invention;

FIG. 2 is a longitudinal sectional view through the sensing end of the thermocouple assembly of FIG. 1, taken on the plane of the line 2—2 thereof; and FIGS. 3 through 5 are longitudinal sectional views of the sensing end similar to FIG. 2, but illustrating the various steps followed in the method of fabrication of same.

DESCRIPTION OF THE PREFERRED EMBODIMENT

Referring now in detail to the drawings, and initially to FIG. 1, a typical installation of a thermocouple assembly 1 according to the present invention is shown for a heater or furnace or the like. The furnace 2 includes a side wall 3 defining a combustion chamber in which a heat exchanger tube 4 is located. The thermocouple assembly according to the present invention includes a sheathed thermocouple cable 5 with a hot junction or sensing end 6 and a cold junction or reference end 7. As illustrated, the sensing end 6 is mounted directly on the external surface 8 of the tube 4 and the thermocouple cable 5 extends initially axially along the tube and then through the furnace side wall 3 and is connected at its reference end to a temperature recording device 10 or the like. The thermocouple cable 5 may have one or more bends, or may be provided with an expansion loop (not shown) to compensate for relative movement between the cable and heat exchanger tube caused by expansion and contraction of the same during operation of the furnace. Such thermocouple cable at the furnace wall 3 may also have a sliding fit relative to the wall to compensate for such relative movement.

The thermocouple cable may be of common type including an elongate tubular sheath 15 and two thermocouple conductors or wires 16 extending axially in the sheath as shown in FIG. 2. The wires are electrically insulated from each other and from the sheath by a suitable ceramic insulation 17, such as compacted magnesium oxide, aluminium oxide or berylium oxide powders. Although any suitable type of sheathed thermocouple may be used, a preferred type is that commonly sold under the trademark XACTPAK.

The sensing end 6 of the assembly, which is made by performing certain operations on the end of the cable in the manner hereinafter described, is preferably straight with its longitudinal axis coinciding with the longitudinal axis of the adjacent axial portion 18 of the cable, and the sheath 15 of the cable 5 terminating in an end face 19 disposed in a plane extending substantially perpendicular to such axis. Slightly axially inwardly spaced from such end face 19 is the thermojunction 20 of the assembly formed as by welding the ends of the thermocouple conductors 16 to the inside wall 21 of the outer metal sheath. Insulation material 17 completely surrounds the thermojunction, and the end face of the sheath is closed by an end closure 24 of the weld metal which is ground flat to provide a uniformly flat attachment surface 25 perpendicular to the longitudinal axis of the adjacent axial portion of the sheath.

Attached to such attachment surface 25 as by butt welding around the entire periphery of such surface is a performed segment 26 of solid metal preferably made of the same metal as the sheath of the thermocouple cable. This solid metal tip extension 26 has a flat end wall 27 of approximately the same diameter as the flat attachment surface of the end closure 24 to provide substantial intimate contact therebetween, and the overall length of the extension is preferably several times greater than the sheath O.D., with a contact face 28 extending the full length thereof along the same side of the sheath as the measuring junction 20 and adapted for contiguous intimate contact with the skin or external surface of the tube 4. Such contact face 28 is also desirably substantially flat and flush with the exterior surface of the adjacent axial portion 18 of the cable whereby such adjacent axial portion is also contiguous with the tube to facilitate mounting thereof on the tube when installed as shown in FIGS. 1 and 2 with the contact face contiguous with the skin or surface of the tube. The side 29 of the extension 26 opposite the contact face 28 is desirably curved and gradually slopes downwardly from the O.D. of the end closure to the outermost end of the extension.

The sensing end 6 of the thermocouple assembly is secured to the tube 4 by a weldment 30 which extends around the periphery of the contact face 28.

The method of fabricating the thermocouple assembly will be described with additional reference to FIGS. 3 through 5. The measuring junction 20 is formed first by removing a portion of the insulation 17 at the sensing end of the cable to expose the ends of the thermocouple wires 16 a sufficient distance to permit the ends of the wires to be moved to the inside surface 21 of the sheath wall and attached thereto by welding the wires to such inside surface a short distance axially inwardly from the end face 19 of the sheath. The open space surrounding the measuring junction at the end of the sheath is then repacked with insulation material 17 completely surrounding the measuring junction.

Next the end face 19 of the sheath is closed by an end closure 21 formed by applying weld metal thereto as shown in FIG. 3, which is then ground flat as shown at 25 in FIG. 4 to facilitate welding of the preformed segment 26 of solid metal to the end closure in the manner illustrated in FIG. 5. Preferably, both the weld metal end closure 21 and preformed segment 26 of solid metal are made of the same or similar metal as the sheath metal which has high temperature strength and resistance to corrosion. For example, the sheath and weld metal and preformed segment extension may be made of stainless steel.

Prior to welding the preformed segment 26 to the weld metal end closure 21, care should be taken to make certain that the contact face 28 of the preformed segment is positioned on the same side of the thermocouple sensing end 6 as the measuring junction 20 so that the measuring junction will be more positively positioned to the side of the thermocouple which will ultimately be in contact with the surface to be sensed.

To complete the fabrication of the assembly, the cold junction end 7 may be formed in conventional manner for suitable connection to the reference meter 10 or other indicating or recording device. The assembly may also be provided with bends and/or expansion loops previously described, these latter operations usually being performed at the installation site to conform to the geometry of the furnace or heater to which the thermocouple assembly is to be attached.

The finished thermocouple assembly 1 is then welded directly to the tube surface by placing the contact face 28 in contiguous relationship therewith with the sensing end 6 and the adjacent portion 18 of the cable extending axially along the length of the tube 4. A single weld pass or several weld passes 30 may be made around the periphery of the contact face to secure the sensing end to the tube.

From the foregoing, it will now be apparent that the thermocouple assembly of the present invention and particularly the sensing end thereof is much easier and less costly to fabricate then other sensing ends of the same general type. Moreover, with the subsequent addition of the preformed segment of solid metal to the weld metal end closure to form the unique end configuration, the contact face of the assembly will have a more consistent shape, and the integrity of the measuring junction closure will be assured, making it better suited for weld attachment by the customer to the surface whose temperature is to be monitored.

Although the invention has been shown and described with respect to a certain preferred embodiment, it is obvious that equivalent alterations and modifications will occur to others skilled in the art upon the reading and understanding of the specification. The present invention includes all such equivalent alterations and modifications and is limited only by the scope of the claims.

I claim:

1. A thermocouple assembly comprising:
a sheathed thermocouple cable including an elongate tubular metallic sheath having an axial end portion, a pair of axially extending thermocouple conductors in said sheath, and electrically insulating means in said sheath supporting said conductors in electrically insulated spaced relation from each other and from said sheath, said cable having a sensing end adjacent said axial end portion, said sheath terminating at said axial end portion in an end face, a measuring junction of said conductors within said sheath located axially inwardly a short distance from said end face, said electrically insulating means substantially filling said sheath between said measuring junction and said end face, a preformed segment of solid metal extending axially outwardly from said end face, said preformed segment having a contact face extending substantially parallel to said axial end portion of said sheath and adapted for contiguous intimate contact with a surface whose temperature is to be sensed when mounted thereon.

2. The assembly of claim 1 wherein said contact face is substantially flush with the outer diameter of said axial end portion of said sheath.

3. The asembly of claim 1 wherein said measuring junction is formed by welding said conductors to the inside wall of said sheath a short distance from said end face on the same side as said contact face.

4. The assembly of claim 3 further comprising an end closure of weld metal between said sheath end face and said preformed segment, said end closure closing said sheath at said end face, and said electrically insulating means being disposed between said end closure and said measuring junction.

5. The assembly of claim 4 wherein said end closure is ground flat axially outwardly of said end face to provide a uniformly flat attachment surface of said preformed segment extending substantially perpendicular to the longitudinal axis of the axial end portion of said sheath.

6. The assembly of claim 5 wherein said preformed segment also includes a flat end wall of approximately the same diameter as said flat attachment surface of said end closure and in intimate contact therewith, said preformed segment being welded to said end closure around the entire periphery of said flat end wall and flat attachment surface.

7. The assembly of claim 6 wherein said contact face on said preformed segment has an overall length several times greater than the outer diameter of said sheath.

8. The assembly of claim 7 wherein the side of said preformed segment opposite said contact face is curved and gradually slopes from the outer diameter of said end closure opposite said contact face to the outermost end of said contact face.

9. A thermocouple installation comprising:
a surface whose temperature is to be sensed;
a thermocouple assembly including a sheathed thermocouple cable in the form of an elongate tubular metallic sheath having an axial end portion, a pair of axially extending thermocouple conductors in said sheath, electrically insulating means in said sheath supporting said conductors in electrically insulated spaced relation from each other and from said sheath, said cable having a sensing end adjacent said axial end portion, said sheath terminating at said axial end portion in an end face;
a measuring junction of said conductors within said sheath located axially inwardly of said end face with said electrically insulating means filling said sheath between said measuring junction and said end face, and a preformed segment of solid metal attached to said end face, said preformed segment having a contact face extending substantially parallel to said axial end portion of said sheath, and means for mounting said assembly on said surface with said contact face in contiguous intimate contact with said surface.

10. The installation of claim 9 wherein said means for mounting includes direct welding of said contact face to said surface.

11. The installation of claim 10 wherein said contact face is substantially flush with the outer diameter of said axial end portion of said sheath, whereby said axial end portion is also in contiguous intimate contact with said surface.

12. The installation of claim 9 wherein said measuring junction is formed by welding said conductors to the inside wall of said sheath a short distance from said end face on the same side as said contact face whereby said measuring junction is located as closely as possibly to said surface.

13. The installation of claim 12 further comprising an end closure of weld metal between said sheath end face and said preformed segment closing said sheath at said end face, said electrically insulating means filling said sheath between said end closure and said measuring junction.

14. A method of fabricating a thermocouple assembly using a thermocouple cable portion including an elongate tubular metallic sheath, a pair of axially extending thermocouple conductors in said sheath, and electrical insulation in said sheath to support and space apart said conductors from each other and from said sheath, comprising the steps of removing a portion of the insulation from an end of such sheath to expose the ends of the conductors, moving such exposed conductor ends to the inside surface of the sheath wall, welding such conductor ends to such inside surface a short distance axially inwardly from the end face of such sheath end, repacking the open space surrounding the measuring junction with insulation and filling such sheath with insulation up to such sheath end, and attaching a preformed segment of solid metal to the end face of the sheath, such preformed segment having a contact face extending substantially parallel to the end portion of the sheath located on the same side as such measuring junction and adapted for contiguous intimate contact with a surface whose temperature is to be sensed when mounted thereon.

15. The method of claim 14 wherein prior to the step of attaching a preformed segment of solid metal to the end face of the sheath, an end closure of weld metal is applied to such end face closing such sheath at such end face with such insulation disposed between such closed end face and such measuring junction.

16. The method of claim 15 wherein such end closure is ground flat axially outwardly of such end face to provide a uniformly flat attachment surface for such preformed segment extending perpendicular to the longitudinal axis of the adjacent axial portion of the sheath.

17. The method of claim 16 wherein such preformed segment also includes a flat end wall of approximately the same diameter of such flat attachment surface on such end closure for intimate contact therewith, such preformed segment being welded to such end closure around the entire periphery of such flat end wall and flat attachment surface.

* * * * *